(12) United States Patent
Lo Iacono

(10) Patent No.: US 6,917,042 B2
(45) Date of Patent: Jul. 12, 2005

(54) CRYSTALLINE FILTERS FOR ULTRAVIOLET SENSORS

(75) Inventor: Dominic N. Lo Iacono, Budd Lake, NJ (US)

(73) Assignee: VLOC Incorporated, New Port Richey, FL (US)

(*) Notice: Subject to any disclaimer, the term of this patent is extended or adjusted under 35 U.S.C. 154(b) by 0 days.

(21) Appl. No.: 10/620,930

(22) Filed: Jul. 16, 2003

(65) Prior Publication Data

US 2005/0034655 A1 Feb. 17, 2005

Related U.S. Application Data

(62) Division of application No. 09/414,749, filed on Oct. 6, 1999, now Pat. No. 6,620,347.

(51) Int. Cl.[7] .................................................. G01J 5/00
(52) U.S. Cl. ........................................................ 250/372
(58) Field of Search ........................................ 250/372

(56) References Cited

U.S. PATENT DOCUMENTS

| | | | |
|---|---|---|---|
| 3,514,265 A | 5/1970 | Pastore ....................... | 117/940 |
| 3,649,552 A | 3/1972 | Robinson et al. ............ | 423/464 |
| 3,684,727 A | 8/1972 | Phillips ....................... | 117/940 |
| 3,892,971 A | 7/1975 | Arthur et al. ................ | 359/885 |
| 4,050,905 A | 9/1977 | Swinehart ................... | 252/584 |
| 4,317,751 A | 3/1982 | Kraushaar et al. .......... | 252/584 |
| 4,578,583 A * | 3/1986 | Ciammaichella et al. ... | 250/372 |
| 4,859,028 A | 8/1989 | Moore et al. ................ | 359/885 |
| 4,884,855 A | 12/1989 | Moore et al. ................ | 252/584 |
| 5,025,159 A | 6/1991 | Miller et al. ................. | 117/928 |
| 5,204,773 A * | 4/1993 | Guida .......................... | 359/361 |
| 5,290,730 A | 3/1994 | McFarlane et al. ......... | 423/464 |
| 5,837,054 A * | 11/1998 | Singh et al. .................. | 117/10 |
| 6,270,570 B2 | 8/2001 | Ohba et al. .................. | 117/940 |
| 6,342,312 B2 | 1/2002 | Oba et al. .................... | 252/584 |
| 6,369,392 B1 | 4/2002 | Ruderman et al. .......... | 117/940 |
| 6,620,347 B1 * | 9/2003 | Lo Iacono ................... | 252/584 |

OTHER PUBLICATIONS

W. Kaiser et al., "Fluorescence and Optical Maser Effects in $CaF_2$:$SM^{++}$," *Physical Review*, vol. 123, No. 3, Aug. 1, 1961, pp. 766–769.

P.F. Weller et al., "Chemical and Optical Studies of Samarium Doped $CaF_2$ Type Single Crystals," *Journal of the Electrochemical Society*, Jan. 1995, pp. 74–77.

* cited by examiner

Primary Examiner—Constantine Hannaher
(74) Attorney, Agent, or Firm—The Webb Law Firm

(57) ABSTRACT

A crystal filter and a method of making a crystal filter capable of transmitting radiation within a particular pass band is disclosed. The crystal filter is particularly appropriate for a UV detection system, where the pass band is between about 200 to about 350 nm. A UV detection system incorporating the crystal filter is also described. One embodiment of crystal filter is formed from a single-crystal transparent host, such as a fluoride host, codoped with lanthanide or actinide fluorides and lanthanide or actinide nitrides, oxides, borides, carbides or hydroxides. Filter crystals according to the present invention can be grown by various crystal growth methods, including Czochralski and Bridgeman crystal growth methods.

24 Claims, 3 Drawing Sheets

CRYSTALLINE FILTERS FOR ULTRAVIOLET SENSORS

PRIORITY

This application is a divisional of U.S. patent application, Ser. No. 09/414,749, filed Oct. 6, 1999 now U.S. Pat. No. 6,620,347, and is incorporated herein by reference.

BACKGROUND

1. Field of the Invention

This invention relates to an ultraviolet crystal filter material for creating a solar blind optical filter and a UV detection system having an ultraviolet crystal filter.

2. Discussion of Related Art

Ultraviolet (UV) filters and sensors, are used for a variety of applications, including fire detection systems, electrical corona detection systems, aircraft landing aids, and missile approach warning systems. Due to the small amount of solar radiation in the UV range (i.e., wavelengths of about 350 nm and below) at low altitudes, it is possible to have UV detection in daylight conditions. UV sensors that operate in a wavelength range of between about 350 nm to about 200 nm are considered to be "Solar Blind".

One example of a solar blind UV detection system occurs in fire alarm systems where the presence of a threshold amount of UV radiation is used to detect a fire. Upon detection of the fire, the alarm system can trigger fire alarms, fire suppression systems or calls to the local fire department.

Another example use of a solar blind UV sensor can be found in the AN/AAR-47 missile warning system. This system is typically used on helicopter platforms and utilizes UV sensors to detect infrared or radar guided missile threats. If a missile threat is detected, appropriate countermeasures, such as the ejection of flare decoys or chaff, can be deployed.

A UV optical system includes optical components for focusing radiation onto a UV sensitive sensor, a filter for reducing the amount of radiation not in the UV window (e.g., 200–350 nm), and electronics which process and act on signals from the UV sensitive sensor. To date, most UV optical filters include a series of optical filter elements that are stacked to achieve a desired spectral response. For example, a solar blind UV filter may have a pass band of between the wavelengths of about 200 nm to about 350 nm. Each optical element in the series is a single separate optical filter.

FIG. 1 shows an optical filter 1 having a single filter element, film 2, on a substrate 3. Substrate 3 can be an optically transparent layer that provides structural strength. An optically transparent layer is a layer of material transparent in the wavelength range of interest, e.g. between about 200 nm and about 350 nm for a solar blind UV filter. Alternatively, substrate 3 may be a detector or other optical element related to detection of the transmitted optical radiation. Also, film 2 may be mounted alone or stacked with other films 2 that also provides optical filtering having a particular spectral response. Typically, film 2 is of a commercially available organic dye suspended in polyvinyl alcohol plastic.

There are numerous problems with the use of organic dye films. These films degrade with exposure to fluids and temperatures above 100° C. Additionally, organic dye films typically have low transmission in the desired band-pass region. Organic dye films are also physically easily damaged. Examples of organic dyes available for films can be found in M. Kasha, Opt. Soc. Am., 38, 929, (1948), and S. F. Pellicori et al., Apl. Oct. 5, 12, 1966.

It is desirable, therefore, to provide a UV filter with better transmission characteristics within the desired band-pass region. It is also desirable for the filter to be stable at temperatures as high as 150° C. Also, it is desirable for the filters to be chemically stable, especially with respect to fluids that may be present in the working environment or during manufacturing of the filter-detector system. Additionally, it is desirable to provide filters that have low levels of fluorescence within the operating band of the filter when exposed to UV radiation.

SUMMARY

In accordance with the present invention, a crystal filter having absorption bands such that a transmission pass band is formed is presented. In most embodiments, the pass band is appropriate for use as a solar-blind UV filter (i.e., around 200 nm to around 350 nm wavelength). The crystal filter is a single-crystal host material doped with one or more optically active (e.g., optically absorbing) dopant materials. The single-crystal host material is substantially optically transparent (i.e., having low absorption) at least within the desired pass band. The optically active dopants create optical absorption bands above and below the desired pass band. In the UV filter applications, the single-crystal host material can be any single crystal that is transparent in the active region (e.g., wavelength region between about 200 to about 350 nm for solar-blind UV filters), including the alkaline earth fluorides, zinc fluoride or cadmium fluoride. The single-crystal host material can be codoped with a lanthanide or actinide fluoride and a corresponding lanthanide or actinide nitride, boride, oxide, carbide or hydroxide material. Any combination of codopants that provide the desired absorption pass-band can be utilized.

The alkaline earth fluoride host materials include magnesium fluoride ($MgF_2$), calcium fluoride ($CaF_2$), strontium fluoride ($SrF_2$), and barium fluoride ($BaF_2$). Additional fluoride host materials include $ZnF_2$ and $CdF_2$. Each of these host crystal materials have suitable optical transmission in the wavelength region of about 200 nm to about 350 nm and can readily be codoped with lanthanide or actinide fluorides and lanthanide or actinide nitrides, borides, oxides, carbides or hydroxides to provide the desired spectral characteristics. The lanthanide and actinide series of elements includes Ce, Pr, Nd, Sm, Eu, Gd, Tb, Dy, Ho, Er, Tm, Yb, Lu, and U. The doping is accomplished by addition of the appropriate fluorides and nitride, boride, oxide, carbide or hydroxide to a mixture that forms the crystal melt during crystal growth.

A particular band-pass region for the filter can be arranged by appropriately doping the host crystal. In one embodiment, denoted filter material type 1 (FMT-1), $CeF_3$ and CeN are added to $CaF_2$ to yield a crystal filter which has a wide absorption band between about 290 nm to about 335 nm, centered around about 310 nm. This codoping enables the crystal filter to absorb in a sufficiently wide band to block any unwanted fluorescence near the operating UV wavelengths of the detector, while allowing transmissions in a portion of the 200–350 nm wavelength range, about 220 nm to about 280 nm.

In another embodiment of the invention, denoted FMT-2, the absorption band is widened to include higher wavelengths by addition of $CeF_3$, CeN, $EuF_3$, and EuN to $CaF_2$. The FMT-2 crystal can have an absorption band which extends from about 290 nm to 410 nm while having good transmission in the desired UV wavelengths of between about 220 nm and about 280 nm.

Yet another embodiment of the invention, denoted FMT-3, includes a calcium fluoride ($CaF_2$) host crystal codoped with cerium fluoride ($CeF_3$) and cerium carbide ($CeC_2$). A fourth embodiment, denoted FMT-4, includes a calcium fluoride ($CaF_2$) host crystal codoped with cerium fluoride ($CeF_3$) and cerium hydroxide ($Ce(OH)_2$).

In some embodiments of crystal filters according to the present invention, the crystal filter includes a single crystal fluoride host (e.g., $MgF_2$, $CaF_2$, $SrF_2$, $BaF_2$, $ZnF_2$ or $CdF_2$) codoped with a lanthanide or actinide fluoride compound and a lanthanide or actinide nitride, boride, carbide, oxide or hydroxide compound. The dopant fluoride compound does not necessarily include the identical lanthanide or actinide element as the dopant nitride, boride, carbide, oxide or hydroxide compound. Additionally, the crystal filter may be codoped with more than two codopants.

Crystal filters according to the present invention are readily grown using a number of well-known crystal growth techniques, including Czochralski and Bridgeman techniques. The particular crystal growth condition for growing crystal filters are further discussed below. In most embodiments, alkali fluorides are added to the crystal growth to increase distribution coefficients of the dopants. The alkali fluorides include Li, Na, K, Rb, and Cs fluoride. In some growth methods involving nitride, oxide or hydroxide codopants, the corresponding gaseous component can be introduced to the crystal melt during growth or diffused into a pre-grown crystal in order to form the nitride, oxide or hydroxide codopant.

Crystal filters according to the present invention are stable in air to high temperatures. The FMT-1, FMT-2, FMT-3 and FMT-4 crystals, for example, are stable to at least about 450° C. The crystal filters are also very durable and can be easily fabricated into optical elements for use in UV detection systems.

In accordance with another aspect of the invention, a solar-blind UV detection system having a crystal filter is provided. The solar-blind UV detection system includes an optical array, a crystal filter, and a UV detector. In most embodiments, the crystal filter transmits in the range of about 200–350 nm range while absorbing radiation in ranges above about 350 nm in order to block solar radiation from the UV detector system. The filter is a single crystal, codoped filter as has been described above. Other embodiments of the invention can have pass bands in other than the 200–350 nm range.

These and other embodiments of the invention are further described below with references to the following figures.

DETAILED DESCRIPTION OF THE INVENTION

Figure 1:
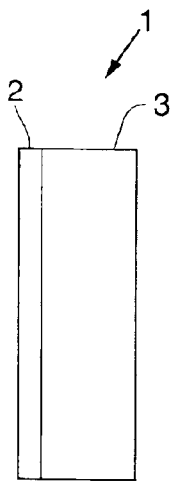
FIG. 1 shows a filter utilizing commercially available dyes.
Figure 2:
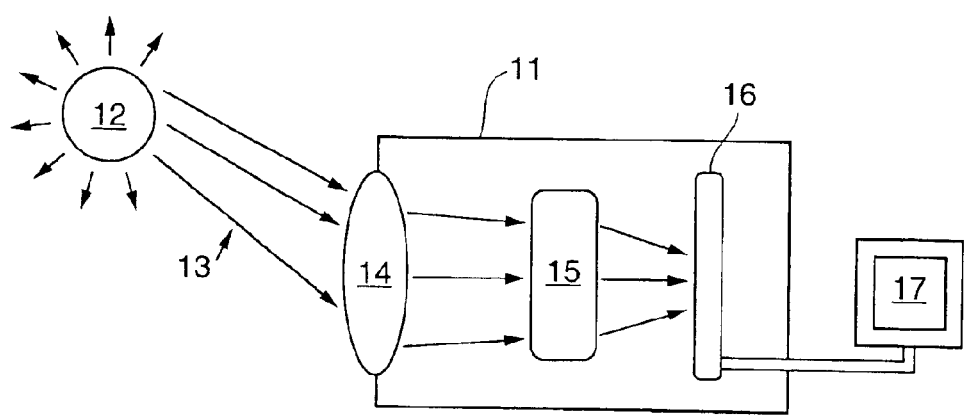
FIG. 2 is a diagram of a UV sensor system having a crystal filter according to the present invention.

FIG. 2 is a diagram of a UV detection according to the present invention. The body of the UV solar blind sensor 11 contains an optical array 14 which directs UV light 13 from a source 12 onto crystal filter 15. The optical array 14 can include any collection of optical elements (e.g., lenses) and filters which in most embodiments can absorb in the visible range (i.e., above 350 nm). The ultraviolet light then strikes the FMT crystal filter 15 and only the desired wavelengths are passed onto a light detector 16. Light detector 16 then passes a signal to an alarm or display device 17.

Light detection 16 can include any detection device for detecting radiation in the desired wavelength range, e.g. about 200–350 nm. Detection devices for detector 16 are well known in the art and include, for example, photomultiplier tubes, charge coupled devices (CCDs), and solid state detector devices such as gallium nitride detectors. Light detector 16 also includes detection electronics associated with the detection device (e.g., electronics for signal processing, data displays and data acquisition). Alarm or display device 17 can be any device which, upon detection of a threshold level (which can be set as low as desired), alerts a user of the presence of UV radiation. In the case of a fire detector, for example, alarm or display device 17 may alert a conventional alarm system to evacuate a building and alert a fire department and/or fire suppression system.

Figure 3:
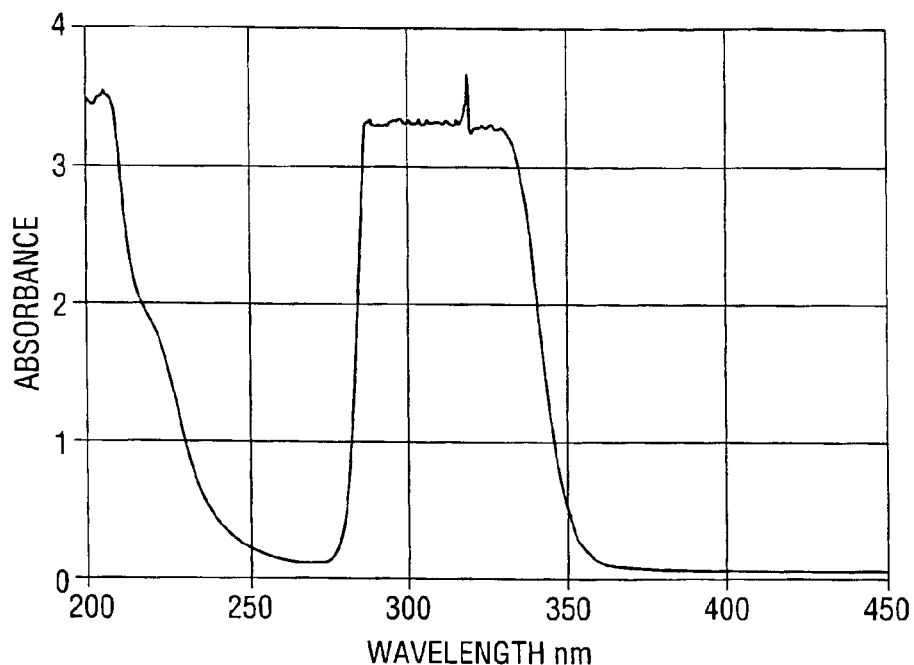
FIG. 3 shows absorption spectra before and after annealing at 450° C. for 2 hrs. in air of an embodiment of a FMT-1 crystal filter according to the present invention.
Figure 4:
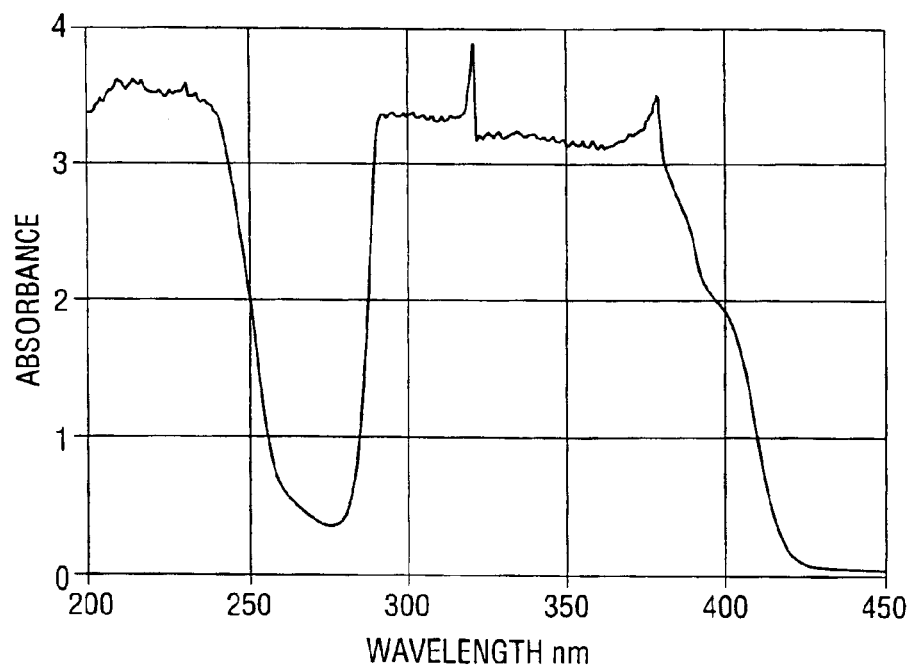
FIG. 4 shows absorption spectra before and after annealing at 450° C. for 2 hrs. in air of an embodiment of a FMT-2 crystal filter according to the present invention.
Figure 5:
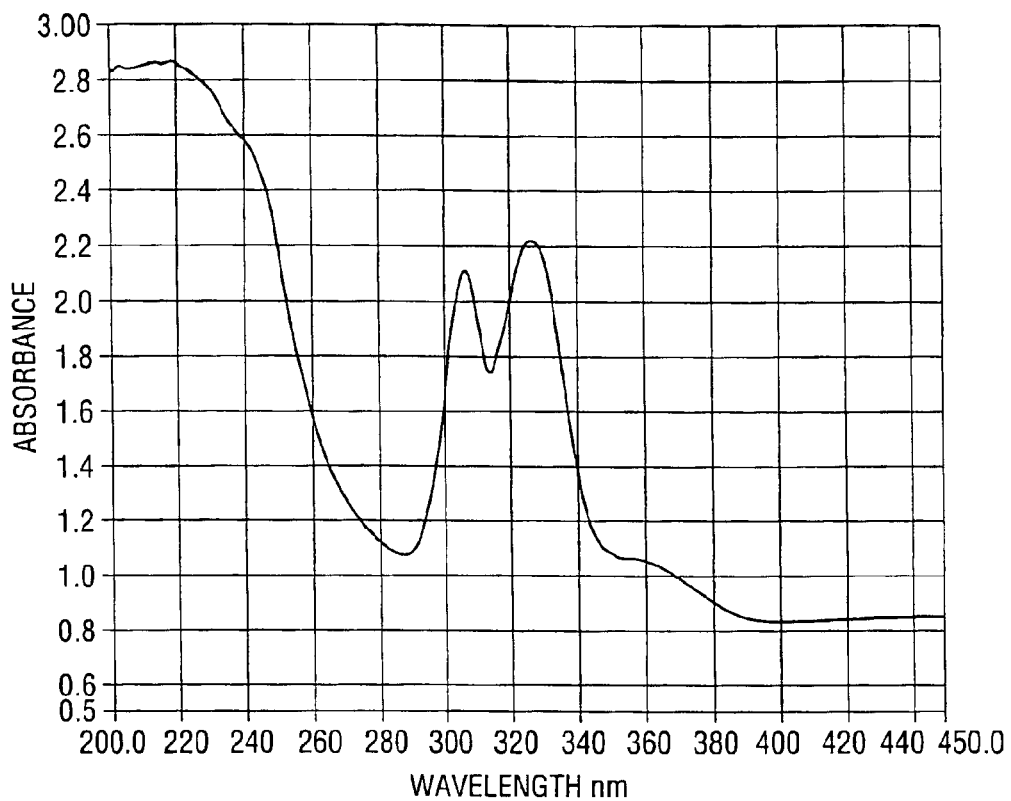
FIG. 5 shows absorption spectra before and after annealing at 450° C. for 2 hrs. in air of an embodiment of a FMT-3 crystal filter according to the present invention.
Figure 6:
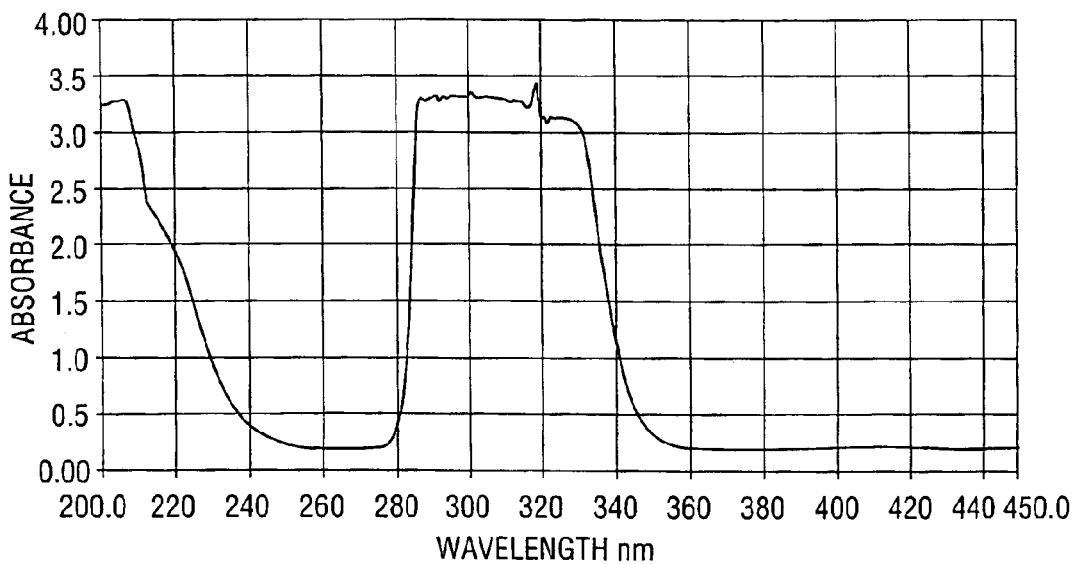
FIG. 6 shows absorption spectra before and after annealing at 450° C. for 2 hrs. in air of an embodiment of a FMT-4 crystal filter according to the present invention.

In most embodiments, crystal filter 15 is an alkaline earth fluoride which is codoped with a lanthanide or actinide fluoride and a lanthanide or actinide nitride, boride, carbide, oxide or hydroxide. The fluoride host crystal can be an alkaline earth fluoride, zinc fluoride ($ZnF_2$) or cadmium fluoride ($CdF_2$). The alkaline earth fluorides include magnesium fluoride ($MgF_2$), calcium fluoride ($CaF_2$), strontium fluoride ($SrF_2$), and barium fluoride ($BaF_2$). These single-crystal host materials transmit in the 200–350 nm region, each having a UV absorption edge of around 150 nm. The lanthanide and actinide elements include Ce, Pr, Nd, Sm, Eu, Gd, Tb, Dy, Ho, Er, Tm, Yb, Lu, and U. The combination of lanthanide or actinide fluoride dopant, and lanthanide or actinide nitride, boride, oxide, carbide or hydroxide doping, provides optical absorption bands which limits the transmissions of the crystal filters to the useful range of wavelengths and in wavelengths above the absorption band, away from the useful range of wavelength, i.e. creates a pass-band having the desired characteristics. FIG. 3, for example, shows an optical absorption spectrum of one embodiment of the invention, FMT-1 ($CaF_2$ codoped with $CeF_3$ and CeN). The crystal filter transmits in the pass-band region of around 220 nm to about 275 nm and above about 350 nm. FIGS. 4 through 6 show a similar optical absorption spectrum for other examples of embodiment crystal filters: FMT-2 ($CaF_2$ codoped with $CeF_3$, CeN, $EuF_3$ and EuN), FMT-3 ($CaF_2$ codoped with $CeF_3$ and $CeC_2$) and FMT-4 ($CaF_2$ codoped with $CeF_3$ and $Ce(OH)_2$), respectively.

The optical absorption spectra shown in FIGS. 3 through 6 were taken using a Perkin Elmer Lamda 19 UV-VIS-NIR spectrophotometer. FIGS. 3 through 6 each show two spectra, one taken before and one after a 2 hours 450° C. anneal in air, however the two spectra overlap on the scale shown in the Figures and are indistinguishable. FIGS. 3 through 6, therefore, also show that embodiments of the invention are stable at temperatures of at least 450° C.

Filter crystal 15 (FIG. 2) can be formed from a number of growth techniques, including Czochralski and Bridgeman methods of crystal growth. In general, crystals are grown from a melt, i.e., liquid solution, of the constituent elements of a mixture. The crystal formed from the melt of the mixture will include the constituent elements of the mixture in proportion related to the proportion of those elements in the mixture. Several examples of mixtures for growing filter crystals according to the present invention are discussed below.

Component Mixtures for UV Filter Crystals

Mixture Example 1 (FMT-1 crystals)

In one embodiment of the invention, denoted FMT-1, the mixture from which a filter crystal is grown is primarily comprised of $CaF_2$, which forms the host crystal. The mixture further includes codopants including about 0.01 to about 5.0 mole percent of cerium fluoride ($CeF_3$) and about 0.001 to about 1.0 mole percent of CeN. Other constituents may also be added to the mixture. For example, about 0.01 to about 5.0 mole percent of manganese fluoride ($MnF_2$), about 0.01 to about 5.0 mole percent of cobalt fluoride ($CoF_2$), and/or about 0.01 to about 5.0 mole percent of lead fluoride ($PbF_2$) may be added in order to remove unwanted oxides. In addition, about 0.01 to about 20.0 mole percent of sodium fluoride (NaF) may be added in order to maximize distribution of active components through the resulting crystal.

In one particular embodiment, an FMT-1 filter crystal is grown from a calcium fluoride ($CaF_2$) mixture having about 0.3 mole percent of cerium fluoride ($CeF_3$), about 0.05 mole percent of cerium nitride (CeN), about 0.3 mole percent of manganese fluoride ($MnF_2$) and about 2.0 mole percent of sodium fluoride (NaF).

In one particular example of a mixture for forming an FMT-1 filter, about 12.8074 moles of calcium fluoride ($CaF_2$) powder or broken crystals are mixed and the mixture is transferred to an argon dry box. Then, about 0.3 mole percent of cerium fluoride ($CeF_3$), about 0.05 mole percent of cerium nitride (CeN), about 0.3 mole percent of manganese fluoride ($MnF_2$) and about 2.0 mole percent of sodium fluoride (NaF) is added to the mixture. The mixture is blended to ensure homogeneity. An FMT-1 crystal filter is then grown from a melt of this mixture.

Mixture Example 2 (FMT-2 crystals)

In a second embodiment of the invention, FMT-2, the mixture includes primarily calcium fluoride ($CaF_2$), which is the host material. The mixture also includes codopants of about 0.01 to about 5.0 mole percent of cerium fluoride ($CeF_3$), about 0.001 to about 1.0 mole percent of cerium nitride (CeN); about 0.01 to about 5.0 mole percent of europium fluoride ($EuF_3$), and about 0.001 to about 1.0 mole percent of europium nitride (EuN). As in FMT-1, the mixture can include inactive components. The inactive components may be included about 0.01 to about 5.0 mole percent of manganese fluoride ($MnF_2$), cobalt fluoride ($CoF_2$), or lead fluoride ($PbF_2$) and about 0.01 to about 20.0 mole percent of sodium fluoride (NaF). The inactive components serve to remove unwanted oxides from the melt and to maximize distribution of the active dopants.

In one particular embodiment of a mixture to form the FMT-2 crystal filter, the crystal filter is grown from a mixture having primarily, about 12.8075 moles, calcium fluoride ($CaF_2$) with about 0.2 mole percent of cerium fluoride ($CeF_3$), about 0.05 mole percent of cerium nitride (CeN), about 0.1 mole percent of europium fluoride ($EuF_3$), about 0.05 mole percent of europium nitride (EuN), about 0.3 mole percent of lead fluoride ($PbF_2$), and about 2.0 mole percent of sodium fluoride (NaF).

Mixture Example 3 (FMT-3 crystals)

In a third embodiment of a crystal according to the invention, FMT-3, a host material of about 12.8074 moles of Calcium Fluoride ($CaF_2$) powder or broken crystals is mixed with codopants of about 0.25 mole percent cerium fluoride ($CeF_3$) powder and about 0.01 mole percent of cerium carbide ($CeC_2$) powder. In order to remove any unwanted oxides from the starting materials, one or more of about 0.01 to about 5.0 mole percent manganese fluoride ($MnF_2$), about 0.01 to 5.0 mole percent cobalt fluoride ($CoF_2$), and about 0.01 to about 5.0 mole percent of lead fluoride ($PbF_2$) is added to the mixture. About 1.6 mole percent of sodium fluoride (NaF) can also be added to the mixture. In general, the $CaF_2$ and $CeF_3$ are mixed and transferred to an argon dry box where the remainder of the components are added and blended to ensure homogeneity.

Example Mixture 4 (FMT-4 crystals)

In a fourth embodiment of a filter crystal according to the present invention, FMT-4, a host material of about 12.8074 moles of calcium fluoride ($CaF_2$) powder or broken crystals is mixed with codopants of about 0.30 mole percent cerium fluoride ($CeF_3$). The mixture is transferred into an Argon dry box and about 0.6 mole percent sodium hydroxide (NaOH) is added in order to form the codopant cerium hydroxide ($Ce(OH)_2$) during crystal growth. In order to remove any unwanted oxides from the starting materials, about 0.2 mole percent of lead fluoride ($PbF_2$) is added to the mixture. Additionally, about 1.6 mole percent of sodium fluoride (NaF) is added to the mixture to maximize the distribution coefficients of the constituents.

One skilled in the art will recognize that other mixtures for forming filter crystals according to the present invention can be formed. Example mixtures 1 through 4 are presented for demonstrative purposes only and are not to be considered limiting. Mixtures for forming filter crystals according to the present invention can, for example, include other host materials, including any of the alkali fluorides or $ZnF_2$ or $CdF_2$ and any number of codopants. Embodiments of the invention include any host material having dopants such that a pass band in a desired spectral region is created.

Crystal Growth Methods

Crystal filters according to the present invention can be grown in many ways. As examples, several methods of growing these crystals are discussed below. The crystals can be grown using any number of known methods, including the Czochralski method and the Bridgeman method. In the Czochralski method, the growth mixture is melted in a crucible. Crucibles can be formed from many materials, including platinum, carbon, gold and ceramic. The crucible itself can serve as the heating element to melt the mixture to form a melt or the crucible can be placed in a furnace. The mixture can be any mixture of components for producing a crystal filter according to the present invention, examples of which are discussed above as Example Mixtures 1 through 4. A seed crystal mounted on the end of a rod is inserted into the melt. The seed crystal, around which crystal growth is initiated, is slowly rotated and slowly lifted out of the melt. The crystal forms around the seed crystal.

In the Bridgeman crystal growth method, the mixture is placed in an insulating crucible, most often formed from a ceramic material. The crucible is then placed into an furnace and heated to form a melt. A temperature gradient is formed across the crucible (usually along the longest dimension of the crucible) either by increasing the temperature of the furnace at one end of the crucible relative to the opposite end or by lowering the crucible out of a hot side of the furnace to a cooler side of the furnace. A crystal is formed as the melt cools.

Even though the various common methods of crystal growth are generally well known, the particular parameters of the growth method are unique to growth of each type of crystal. Several examples of particular methods of growing crystal filters according to the present invention are described below.

Crystal Growth Example 1

A mixture is loaded into a crucible for use in a Bridgeman growth system. The mixture can be any mixture of components from growing a filter crystal according to the present invention, including the mixtures described in Mixture Examples 1 through 4 above. In one example, a carbon crucible of about 90 mm by 150 mm, is shaped at one end with a 45° Bridgeman taper. The crucible containing the host material is often loaded into an argon dry box where the codopant material and other components are added. The filled crucible is then sealed from atmospheric contamination with a lid (often of carbon) and removed from the argon dry box. Crucible and mixture can then be placed into a two-zone vacuum furnace capable of obtaining about 1500° C. temperatures. The vacuum furnace is sequentially evacuated and back filled a number of times with an inert gas in order to remove any water or oxygen. Flushing the furnace about three times with argon gas is typically sufficient. The furnace is heated in a controlled fashion above the melting temperature of the mixture in order to create a melt. For the mixtures described in Mixture Examples 1 through 4, the following temperature profile can be implemented:

0.5 Hrs. heating to about 400° C.;
0.5 Hrs. Dwell at about 400° C.;
0.5 Hrs. heating to about 1450° C.;
Dwell at about 1450° C. for remainder of growth.

After the temperature has reached the melt temperature, e.g. about 1450° C., the crucible is slowly lowered out of the heated zone. In most embodiments, the lowering rate is between about 0.5 and about 2.0 mm/hr. In one particular embodiment, the rate is about 1.0 mm per hour. After about 150 mm of lowering, when the crucible is completely lowered out of the heated zone, the crucible has been "accomplished," i.e. the melt has been solidified, and the furnace is slow cooled to room temperature. In most embodiments, the furnace is cooled in about 24 hours. The crystal can then be removed from the furnace and fabricated into optical filter elements. Fabrication of crystal materials (e.g., cutting and polishing) into crystal elements is well known to one skilled in the art. Other mixtures for forming filter crystals according to the present invention may utilize different temperature profiles.

Crystal Growth Example 2

In a second example, a mixture, which can be one of Example Mixtures 1–4 described above, is loaded into a crucible, as was described in Crystal Growth Example 1. The crucible is then placed into a two-zone vacuum furnace, which is then repeatedly backflushed and evacuated with an inert gas (e.g., about 3 times with argon). The furnace is then heated to a temperature above the melting temperature of the mixture for a sufficiently long time to insure uniformity of the melt. In one embodiment, the temperature is raised to about 1450° C. and held for about 2 hours. A temperature gradient is then created along the vertical axis of the crucible (i.e., along the long dimension of the crucible). In most embodiments, the temperature gradient is between about 1–20° C. per centimeter. In one embodiment, it is about 20° C. per centimeter. The furnace is then slowly cooled to grow the crystal. In most embodiments, the cooling rate is between about 5–20° C. per hour. In one embodiment, it is about 10° C. per hour. When the temperature reaches a temperature below which the crystal is formed, the furnace is slowly cooled to room temperature. In one embodiment, when the furnace temperature reaches about 1250° C. the furnace is then cooled to room temperature at a rate of about 50° C. per hour. The crystal is then removed from the furnace at room temperature and fabricated into optical filters.

Crystal Growth Example 3

A third example of crystal growth is applicable to growth of a filter crystal where one of the codopants is a nitride, oxide or hydroxide compound. A mixture, which can be one of Example Mixtures 1 through 4 described above without nitride, oxide or hydroxide compounds, is loaded into a crucible as described in Crystal Growth Example 1. The crucible is then placed into a two-zone vacuum furnace, which is repeatedly backflushed and evacuated with an inert gas (e.g., about 3 times with argon). A tubing, for example an about 5 mm diameter carbon tube, is inserted into the top of the vacuum furnace and extends down into the crucible, ending above the surface of the melt. Crystals are grown with similar growth technique as was described in Examples 1 or 2, but a gas mixture (such as nitrogen, oxygen, or water vapor (for forming hydroxide compounds) and hydrogen gas) is forced down the tube during growth. In most embodiments, about 5 to about 100 cubic centimeters per minute (cc/min) of nitrogen, oxygen or water vapor and about 2 to about 100 cc/min of hydrogen is forced down the tube. In one embodiment, about 100 cc/min of nitrogen, oxygen or water vapor and 20 cc/min of hydrogen is used. The introduction of the gas mixture above the liquid melt causes a small percentage of the lanthanide or actinide fluoride dopant to form the necessary nitride, oxide or hydroxide compound needed for the codoping. After growth, the crystal can be removed from the furnace and fabricated into optical filters.

Crystal Growth Example 4

Another example a mixture, which can be one of example mixtures 1–4 described above, is placed in a flat bottom crucible and then into a vacuum furnace. In most embodiments, a 90 mm diameter flat bottom carbon crucible is utilized. The furnace is repeatedly evacuated and back filled with an inert gas (e.g., about three times with argon gas) prior to the heating cycle. The furnace temperature is raised to a temperature above the melting temperature of the mixture (e.g., about 1450° C.) and homogenized for a period of time (e.g., about two hours). Czochralski growth is then performed, starting with the introduction of a seed crystal at the top of the melt. The seed crystal can be rotated, in most embodiments at about 2–20 rpm, and the temperature lowered until the onset of nucleation on the seed crystal. In one embodiment, the seed crystal is rotated at about 25 rpm and the onset of nucleation occurs at about 1415° C. After nucleation on the seed, the crystal can be grown by pulling the seed out of the top of the melt. The pull rate is typically about 0.1–5.0 mm per hour. In one example, the pull rate is about 4 mm per hour. When a sufficient length of the crystal is achieved (e.g., about 10 cm), the furnace can be cooled to room temperature. Cooling usually occurs over about 24 hours. The crystal can be removed from the furnace and fabricated into optical filter elements.

Crystal Growth Example 5

In another example of crystal growth is applicable to growth of a filter crystal where one of the codopants is a nitride, oxide or hydroxide compound. A mixture, which can be one of example mixtures 1 through 4 described above without nitride, oxide or hydroxide compounds, is loaded into a crucible as described in Crystal Growth Example 4. A Czochralski growth technique as in example 4 is then performed, with the addition of one of a nitrogen gas atmosphere, on oxygen atmosphere, or a water vapor (hydroxide) atmosphere in the furnace. The introduction of the appropriate atmosphere above the liquid melt causes a small percentage of the codopant fluoride compound to form the nitride, oxide or hydroxide compound necessary for the codoping. The resulting crystal filter can be removed from the furnace and fabricated into optical filter elements.

Crystal Growth Example 6

In another example, a crystal filter of the type described above can be made by growing a crystalline thin film on an undoped substrate. A suitable substrate, such as for example calcium fluoride, is placed in a high vacuum deposition chamber. The substrate is heated to a sufficiently high temperature, e.g. 400–600° C. prior to film growth. A crystalline thin film can be deposited on the substrate by common thermal evaporation or sputtering techniques utilizing a mixture such as example mixtures 1–4 described above. The crystalline thin film will include the constituents of the mixture. The substrate and grown crystalline thin film, which can be of thickness from about 0.01–10,000 microns, can be cooled to room temperature, removed from the high vacuum deposition chamber, and used as a crystal filter.

Crystal Growth Example 7

A crystal filter having a nitride, oxide or hydroxide compound codopant can also be produced by in-diffusion of the corresponding one of nitrogen gas (nitration), oxide gas, or hydroxide into a crystal grown with the nitride, oxide or hydroxide compound in the mixture. A crystalline filter material is made, for example, by any of growth examples 1–6 above where the nitride, oxide, or hydroxide compound has been excluded from the mixture and not added to the melt during growth. A filter blank can be made of the crystalline filter material by cutting and polishing the crystal. The crystalline material blank is then placed into a vacuum furnace. The vacuum furnace is repeatedly evacuated and back filled with an inert gas, e.g. argon gas, a number of times, e.g. about three times, in order to remove the ambient atmosphere. The furnace temperature is raised to a temperature just below melting, e.g. about 800–1395° C., and nitrogen gas, oxygen gas or water vapor is introduced into the furnace. The introduction of the gas above the crystalline blank reacts with a small percentage of the fluoride codopant to form the necessary nitride, oxide or hydroxide compound codoping. After a sufficient time of in-diffusion of the gas, e.g., about 2 hours, the crystalline blank can be cooled to room temperature and removed from the furnace. The resulting crystal can then be fabricated into an optical filter element.

Conclusion

The crystal filter FMT-1 ($CaF_2$ host with $CeF_3$ and CeN codoping) prepared by Example 1 has absorption spectra, before and after a two hour thermal anneal at 450° C., is shown in FIG. 3. To demonstrate the temperature stability of the FMT-1, the filter was heated in a box furnace to about 450° C. at a rate of about 25° C. per hour from room temperature, annealed at about 450° C. for about 2 hrs. and then the furnace was shut off and cooled to room temperature. As can be seen from FIG. 3, the two spectra are indistinguishable on the scale of FIG. 3. Similarly, as can be seen from FIGS. 4 through 6, the Crystal filters FMT-2 ($CaF_2$ host with $CeF_3$, CeN, $EuF_3$ and EuN codopants), FMT-3 ($CaF_2$ host with $CeF_3$ and $CeC_2$ codopants), and FMT-4 ($CaF_2$ host with $CeF_3$ and $Ce(OH)_2$ codopants) also exhibit little variation when treated similarly to the FMT-1 crystal shown in FIG. 3.

FIGS. 3 through 6 also show that the corresponding crystal filter embodiments of FMT-1 through FMT-4 have a pass band in the wavelength range appropriate for solar blind UV filters. FIG. 3 shows an embodiment of FMT-1 crystal filter having a pass band of between about 220 nm to about 280 nm. FIG. 4 shows an embodiment of FMT-2 crystal filter having a pass band of between about 250 nm and 280 nm. FIG. 5 shows an embodiment of FMT-3 crystal filter having a pass band of between about 250 nm and about 300 nm. FIG. 6 shows an embodiment of FMT-4 crystal filter having a pass band of between about 220 nm and about 280 nm. Other embodiments of filter crystals according to the present invention can have optical absorption spectra from various codopants tailored to create pass bands of various widths.

The above examples of embodiments of the invention are demonstrative only. One skilled in the art will recognize several variations from the examples specifically discussed. These variations are also intended to be included in this disclosure. As such, the invention is limited only by the following claims.

I claim:

1. A UV detection system, comprising:

an optical system capable of focusing incident radiation;

a UV crystal filter having a pass band in a desired spectral region, the UV crystal positioned to receive focused incident radiation from the optical system; and a radiation detection system sensitive to radiation in at least the pass band of the UV crystal filter, the radiation detection system positioned to receive radiation transmitted through the UV crystal filter, wherein the optical system includes filters that filter out radiation having wavelengths outside of those in the desired spectral region;

wherein the UV crystal filter comprises a host material that is transparent within at least the desired spectral region, and at least one dopant incorporated within the host material;

wherein the at least one dopant provides optical absorption bands such that the crystalline filter has the pass band within the desired spectral region;

wherein the host material is chosen from the group consisting of $MgF_2$, $CaF_2$, $SrF_2$, $BaF_2$, $ZnF_2$, and $CdF_2$; and wherein the at least one dopant includes a fluoride compound dopant.

2. The system of claim 1, wherein the desired spectral region includes radiation having a wavelength of between about 200 nm and about 350 nm.

3. The system of claim 1, wherein the host material is $CaF_2$ and the at least one dopant includes $CeF_3$ and CeN.

4. The system of claim 1, wherein the host material is $CaF_2$ and the at least one dopant includes $CeF_3$, CeN, $EuF_3$ and EuN.

5. The system of claim 1, wherein the host material is $CaF_2$ and the at least one dopant includes $CeF_3$ and $CeC_2$.

6. The system of claim 1, wherein the fluoride compound includes a lanthanide fluoride or an actinide fluoride, wherein the lanthanide or actinide is chosen from the group of elements consisting of Ce, Pr, Nd, Sm, Eu, Gd, Tb, Dy, Ho, Er, Tm, Yb, Lu, and U.

7. The system of claim 1, wherein the at least one dopant further includes a second dopant compound forming one of a nitride compound, an oxide compound, a boride compound, a carbide compound or a hydroxide compound.

8. A UV detection system, comprising:

an optical system capable of focusing incident radiation;

a UV crystal filter having a pass band in a desired spectral region, the UV crystal positioned to receive focused incident radiation from the optical system; and a radiation detection system sensitive to radiation in at least the pass band of the UV crystal filter, the radiation detection system positioned to receive radiation transmitted through the UV crystal filter, wherein the optical system includes filters that filter out radiation having wavelengths outside of those in the desired spectral region;

wherein the UV crystal filter comprises a host material that is transparent within at least the desired spectral region, and at least one dopant incorporated within the host material;

wherein the at least one dopant provides optical absorption bands such that the crystalline filter has the pass band within the desired spectral region; and wherein the host material is $CaF_2$ and the at least one dopant includes $CeF_3$ and CeN.

9. The system of claim 8, wherein the desired spectral region includes radiation having a wavelength of between about 200 nm and about 350 nm.

10. A UV detection system, comprising:

an optical system capable of focusing incident radiation;

a UV crystal filter having a pass band in a desired spectral region, the UV crystal positioned to receive focused incident radiation from the optical system; and a radiation detection system sensitive to radiation in at least the pass band of the UV crystal filter, the radiation detection system positioned to receive radiation transmitted through the UV crystal filter, wherein the optical system includes filters that filter out radiation having wavelengths outside of those in the desired spectral region;

wherein the UV crystal filter comprises a host material that is transparent within at least the desired spectral region, and at least one dopant incorporated within the host material;

wherein the at least one dopant provides optical absorption bands such that the crystalline filter has the pass band within the desired spectral region; and wherein the host material is $CaF_2$ and the at least one dopant includes $CeF_3$, CeN, $EuF_3$ and EuN.

11. The system of claim 10, wherein the desired spectral region includes radiation having a wavelength of between about 200 nm and about 350 nm.

12. A UV detection system, comprising:

an optical system capable of focusing incident radiation;

a UV crystal filter having a pass band in a desired spectral region, the UV crystal positioned to receive focused incident radiation from the optical system; and a radiation detection system sensitive to radiation in at least the pass band of the UV crystal filter, the radiation detection system positioned to receive radiation transmitted through the UV crystal filter, wherein the optical system includes filters that filter out radiation having wavelengths outside of those in the desired spectral region;

wherein the UV crystal filter comprises a host material that is transparent within at least the desired spectral region, and at least one dopant incorporated within the host material;

wherein the at least one dopant provides optical absorption bands such that the crystalline filter has the pass band within the desired spectral region; and wherein the host material is $CaF_2$ and the at least one dopant includes $CeF_3$ and $CeC_2$.

13. The system of claim 12, wherein the desired spectral region includes radiation having a wavelength of between about 200 nm and about 350 nm.

14. A UV detection system, comprising:

an optical system capable of focusing incident radiation;

a UV crystal filter having a pass band in a desired spectral region, the UV crystal positioned to receive focused incident radiation from the optical system; and a radiation detection system sensitive to radiation in at least the pass band of the UV crystal filter, the radiation detection system positioned to receive radiation transmitted through the UV crystal filter, wherein the optical system includes filters that filter out radiation having wavelengths outside of those in the desired spectral region;

wherein the UV crystal filter comprises a host material that is transparent within at least the desired spectral region, and at least one dopant incorporated within the host material;

wherein the at least one dopant provides optical absorption bands such that the crystalline filter has the pass band within the desired spectral region; and wherein the host material is $CaF_2$ and the at least one dopant includes $CeF_3$ and $CeO_2$.

15. The system of claim 14, wherein the desired spectral region includes radiation having a wavelength of between about 200 nm and about 350 nm.

16. A UV detection system, comprising:

an optical system capable of focusing incident radiation;

a UV crystal filter having a pass band in a desired spectral region, the UV crystal positioned to receive focused incident radiation from the optical system; and a radiation detection system sensitive to radiation in at least the pass band of the UV crystal filter, the radiation detection system positioned to receive radiation transmitted through the UV crystal filter, wherein the optical system includes filters that filter out radiation having wavelengths outside of those in the desired spectral region;

wherein the UV crystal filter comprises a host material that is transparent within at least the desired spectral region, and at least one dopant incorporated within the host material;

wherein the at least one dopant provides optical absorption bands such that the crystalline filter has the pass band within the desired spectral region; and wherein the host material is chosen from the group consisting of $SrF_2$, $BaF_2$, $ZnF_2$, and $CdF_2$.

17. The system of claim 16, wherein the at least one dopant includes a fluoride compound dopant.

18. The system of claim 17, wherein the fluoride compound includes a lanthanide fluoride or an actinide fluoride, wherein the lanthanide or actinide is chosen from the group of elements consisting of Ce, Pr, Nd, Sm, Eu, Gd, Tb, Dy, Ho, Er, Tm, Yb, Lu, and U.

19. The system of claim 17, wherein the at least one dopant further includes a second dopant compound forming one of a nitride compound, an oxide compound, a boride compound, a carbide compound or a hydroxide compound.

20. The system of claim 16, wherein the desired spectral region includes radiation having a wavelength of between about 200 nm and about 350 nm.

21. The system of claim 16, wherein the optical system includes filters that filter out radiation having wavelengths above those in the desired spectral region.

22. The system of claim 16, wherein the at least one dopant includes $CeF_3$ and CeN.

23. The system of claim 16, wherein the at least one dopant includes $CeF_3$, CeN, $EuF_3$ and EuN.

24. The system of claim 16, wherein the at least one dopant includes $CeF_3$ and $CeC_2$.

* * * * *